United States Patent [19]

Somerville

[11] Patent Number: 4,748,419
[45] Date of Patent: May 31, 1988

[54] ISOLATION AMPLIFIER WITH PRECISE TIMING OF SIGNALS COUPLED ACROSS ISOLATION BARRIER

[75] Inventor: Thomas A. Somerville, Tucson, Ariz.

[73] Assignee: Burr-Brown Corporation, Tucson, Ariz.

[21] Appl. No.: 856,763

[22] Filed: Apr. 28, 1986

[51] Int. Cl.$^4$ .............................................. H03F 3/38
[52] U.S. Cl. ...................................................... 330/10
[58] Field of Search ...................... 330/10, 207 A, 251

[56] References Cited

U.S. PATENT DOCUMENTS 3,537,022 10/1970 Regan ..................................... 330/10
3,714,540 1/1973 Galloway .......................... 330/10 X Primary Examiner—James B. Mullins
Attorney, Agent, or Firm—Cahill, Sutton & Thomas

[57] ABSTRACT

A low cost, high frequency isolation amplifier includes a first voltage-to-frequency converter producing a first pair of complementary pulses in response to an analog input signal and applying them to a pair of low capacitance capacitors constituting the isolation barrier. The isolation barrier differentiates edges of the first pair of pulse signals and applies the resulting signals to inputs of a sense amplifier including a differential amplifier, a pair of comparators, and a flip-flop to precisely reconstruct the first pair of complementary pulse signals, which then are fed into a decoder circuit including a phase locked loop. The phase locked loop includes a phase detector receiving the reconstructed pair of complementary pulse signals and a second pair of complementary pulse signals produced by a second voltage-to-frequency converter. The output of the phase detector is integrated by a filter circuit, the output of which produces a voltage that represents the analog input signal and causes the output of the second voltage-to-frequency converter to be synchronized with the second pair of complementary pulse signals when the analog output signal matches the analog input signal.

18 Claims, 6 Drawing Sheets

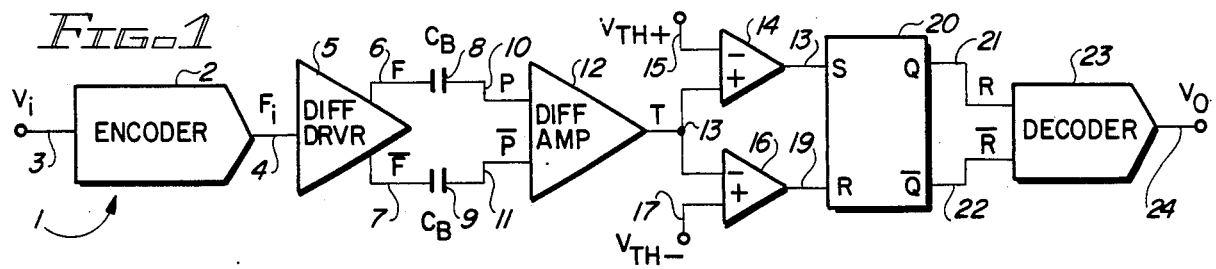
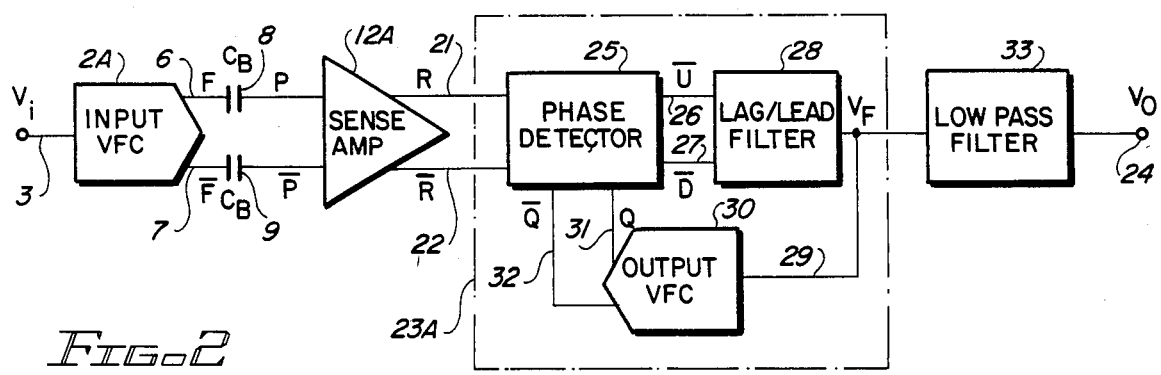
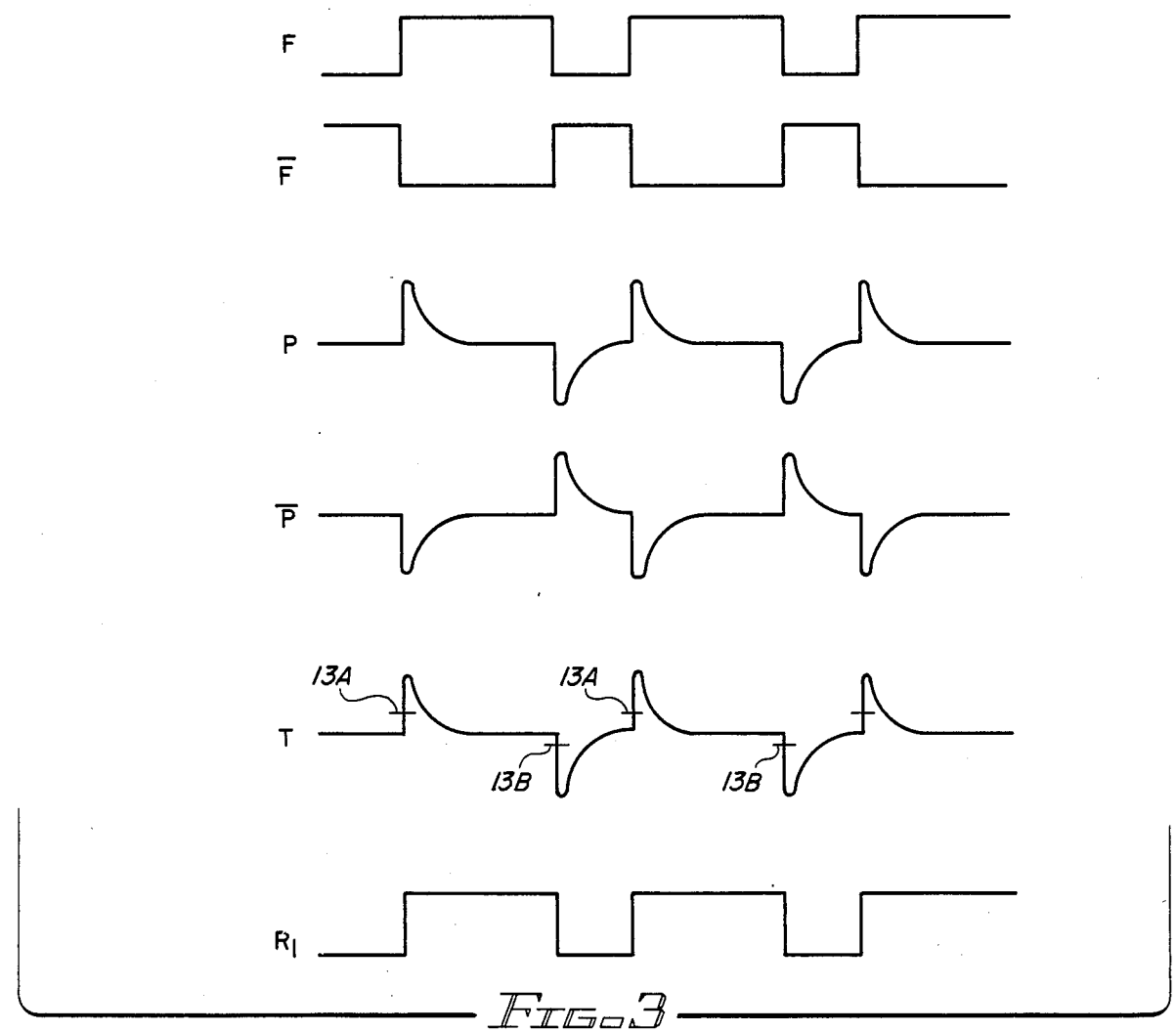

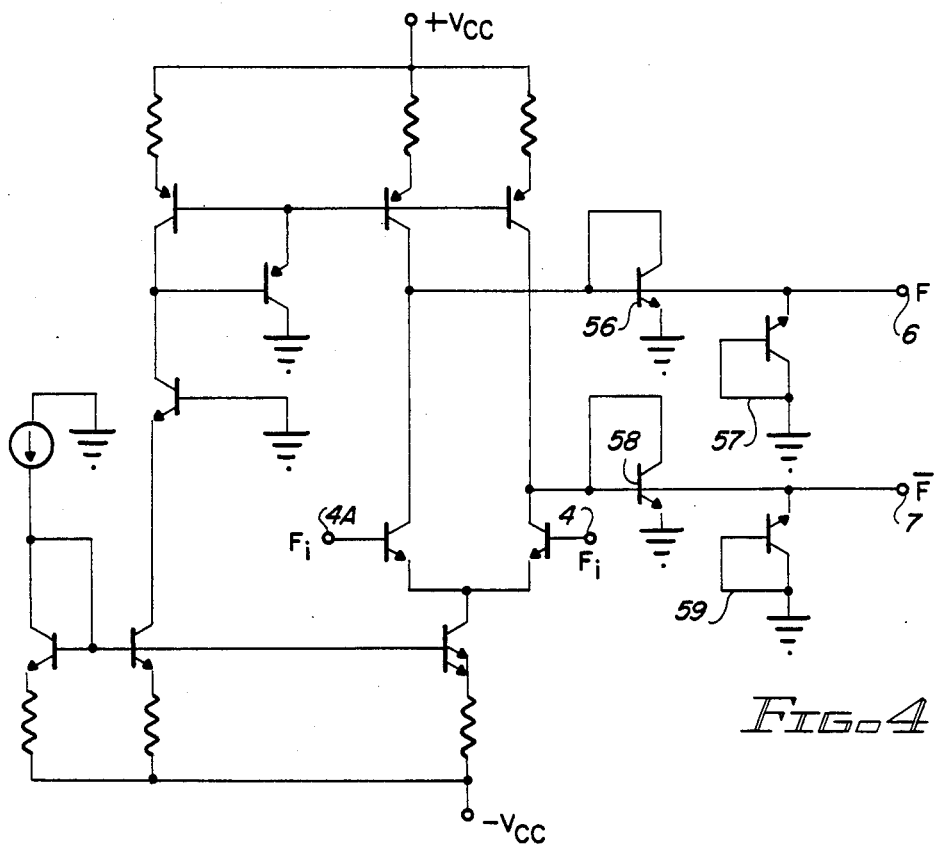
FIG.-4
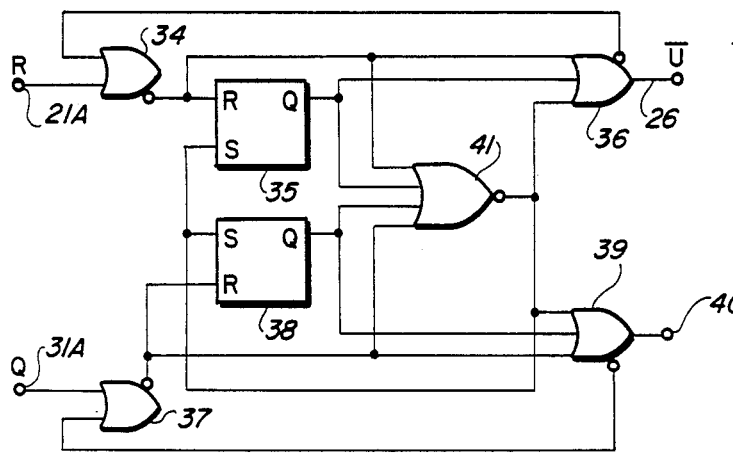
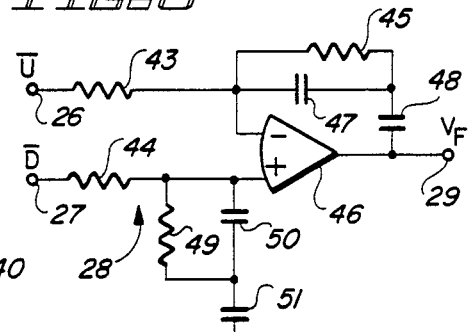
FIG.-6
FIG.-9
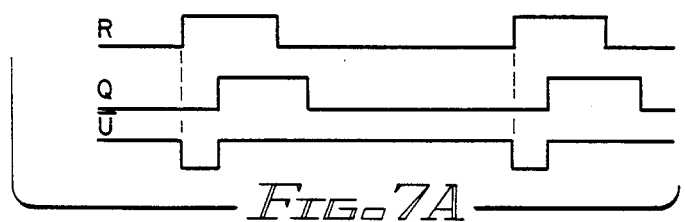
FIG.-7A
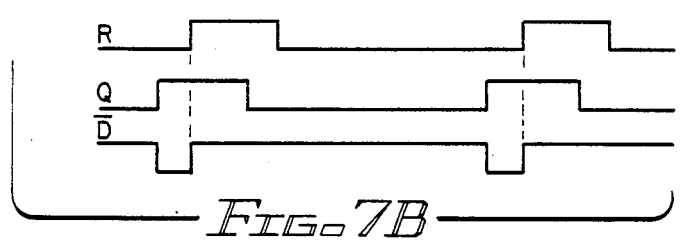
FIG.-7B
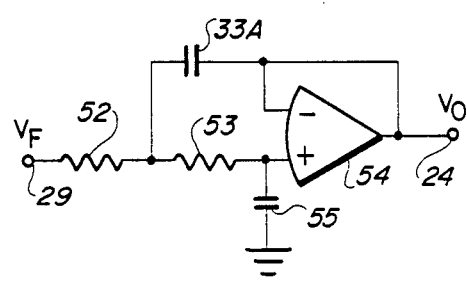
FIG.-10

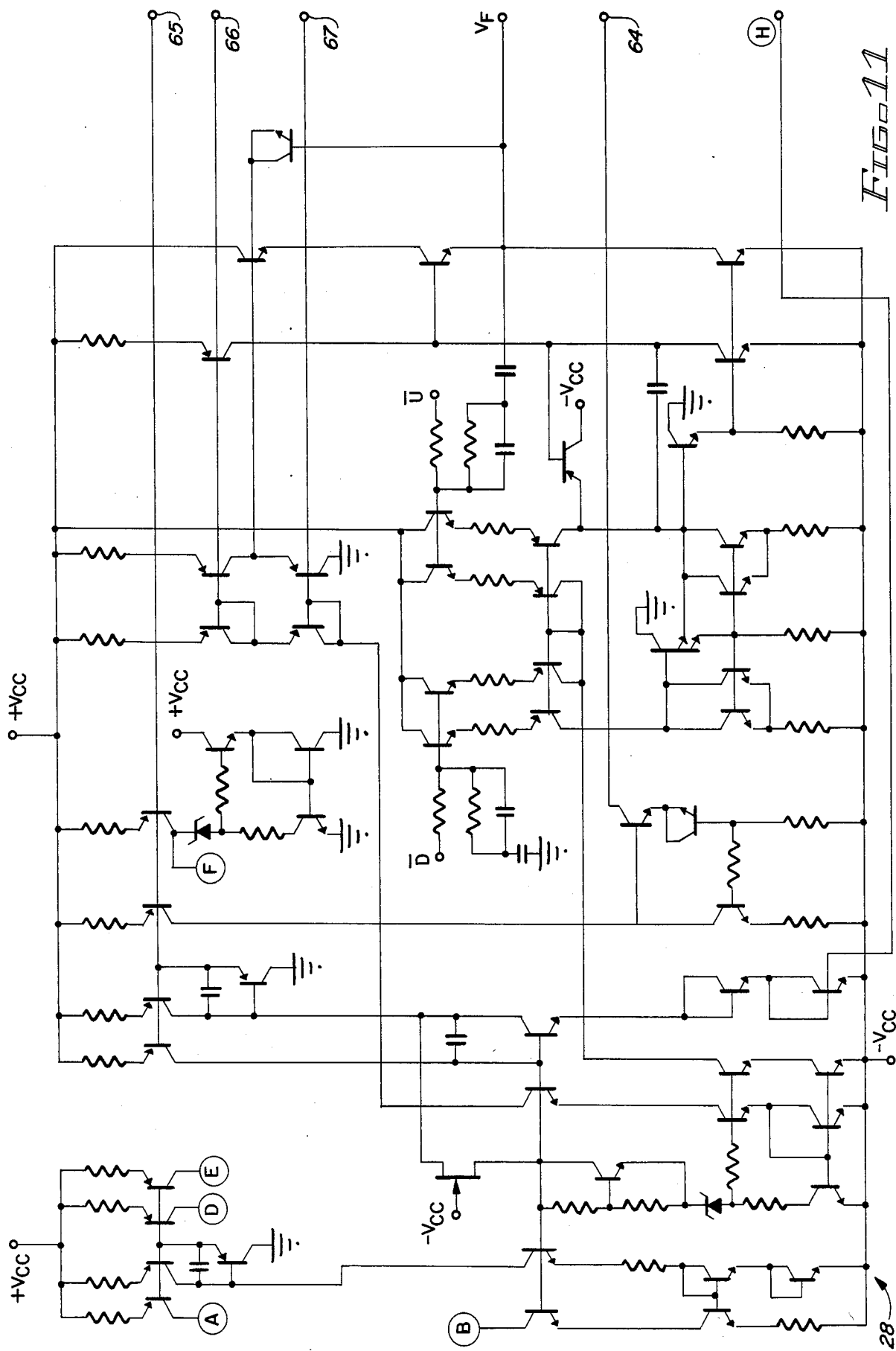

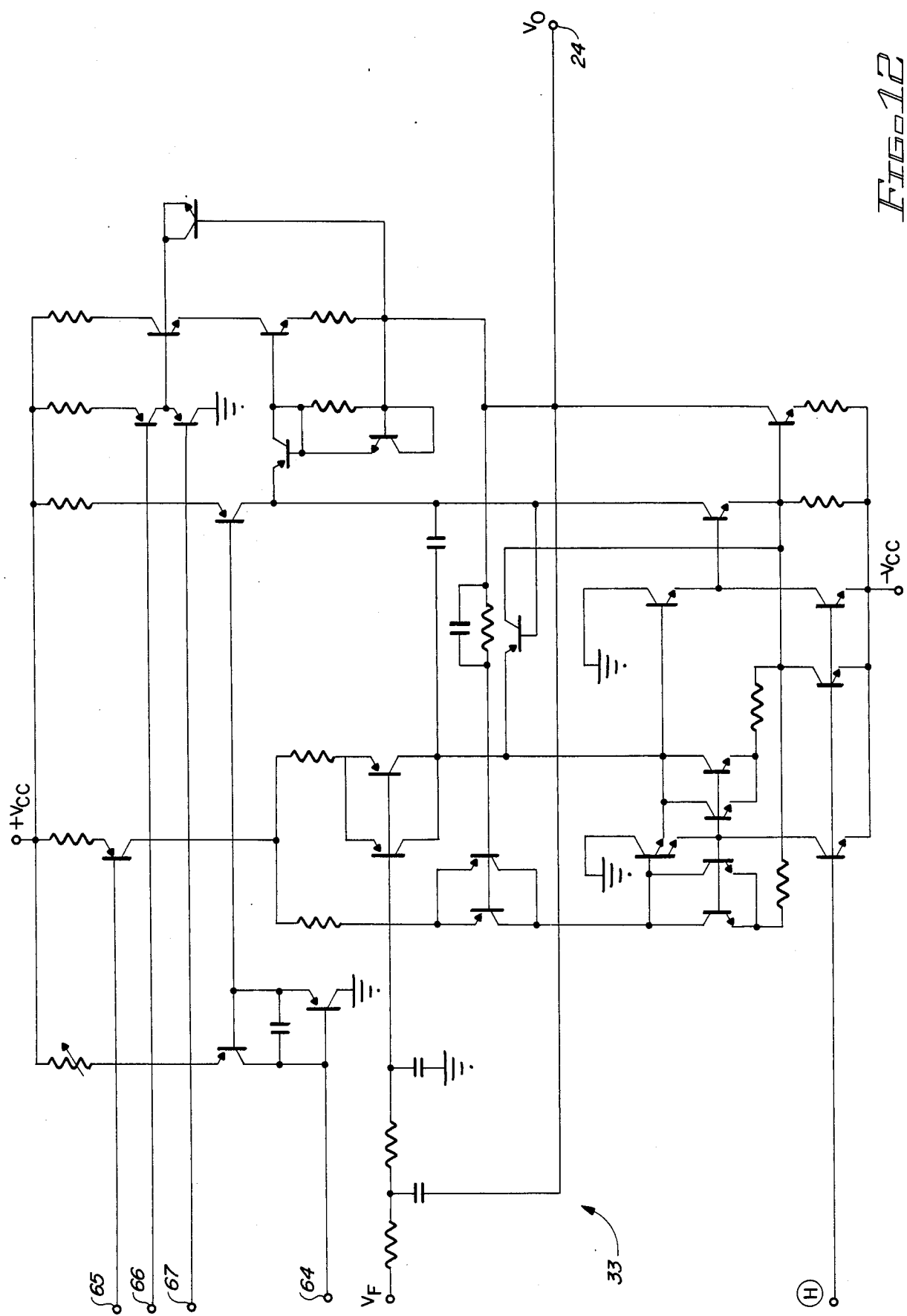

ISOLATION AMPLIFIER WITH PRECISE TIMING OF SIGNALS COUPLED ACROSS ISOLATION BARRIER

CROSS-REFERRENCRE TO RELATED APPLICATION

This application is related to a copending application "PACKAGES FOR HYBRID INTEGRATED CIRCUIT HIGH VOLTAGE ISOLATION AMPLIFIERS AND METHOD OF MANUFACTURE", by Walter B. Meinel, commonly assigned, and filed on even date herewith, Ser. No. 856,720, and incorporated herein by reference.

BACKGROUND OF THE INVENTION

The invention relates to isolation amplifiers, and more particularly to circuitry and techniques for very precisely coupling the times of occurrence of pulse signals across isolation barriers, particularly low capacitance capacitive isolation barriers, to produce a lower cost, higher bandwidth isolation amplifier with higher input-to-output isolation voltage than has heretofore been available.

Isolation amplifiers have been developed for various applications wherein considerably greater electrical isolation between amplifier inputs and outputs is required than can be obtained for conventional "instrumentation amplifiers" and differential amplifiers. Such "isolation amplifiers" are widely used in applications in the medical electronics field and in industrial and military applications wherein it is essential that there be minimum coupling of common mode signals from inputs of amplifiers to their outputs, for example, due to electrostatic discharge signals and electromagnetic pulse signals. Typically, in isolation amplifiers the original analog input signal has been modulated in a variety of ways, including amplitude modulation, frequency modulation, pulse width modulation, duty cycle modulation, and phase modulation. Considerable difficulty has been encountered by circuit designers attempting to obtain high frequency, low distortion performance at low cost and with high reliability for a variety of reasons, including the presence of nonlinearities and temperature dependency of the "isolation barrier" or intermediate transmission medium.

An "isolation" amplifier may be required, for example, to amplify an input AC signal having an amplitude of as low as a few millivolts superimposed upon a large transient common mode voltage as high as 1500 to 3500 volts, or even higher.

Most prior isolation amplifiers have utilized magnetic transformers or optoelectronic devices as isolation barriers. However, the cost of isolation amplifiers using optoelectronic or magnetic isolation barriers has been quite high. Furthermore, the bandwidth of isolation amplifiers using optoelectronic or magnetic isolation barriers has been lower than is desirable . The present state-of-the-art is exemplified by the assignee's Burr-Brown ISO 100 optically coupled isolation amplifier, which has an isolation voltage of 750 volts, a bandwidth of 60 kilohertz, and a cost of roughly $30.00.

Although high performance isolation amplifiers have found an increasing market over the past few years, their cost is so high that most users build their own isolation amplifier circuits, because it is generally perceived by users that it is less expensive to manufacture a particular isolation amplifier that meets their requirements than to purchase a suitable commercially available "off-the-shelf" device. The assignee's marketing research indicates that if high performance isolation amplifiers having an isolation voltage of about 1500 volts or more and bandwidth greater than about 1 kilohertz could be manufactured economically, for example, for less than about $10.00 to $15.00, there would be a large market for such devices. However, until now it has not been possible to provide such an isolation amplifier, despite intensive efforts being directed by major suppliers of hybrid integrated circuits toward this objective.

It is clear that there is an unmet need for an improved low cost, high bandwidth, highly reliable isolation amplifier having an isolation voltage of about 1500 volts or more.

The state-of-the-art is believed to be indicated by commonly assigned U.S. Pat. No. 4,292,595 (Smith) and U.S. Pat. No. 3,714,540. The isolation amplifier in U.S. Pat. No. 4,292,595 introduces the idea of using a pair of capacitors as an isolation barrier in an isolation amplifier. The described circuit is quite complex, and isolation the high voltage isolation barrier capacitors need to be very large, roughly 50 picofarads, making the circuit impractical. The circuit shown in U.S. Pat. No. 3,714,540 cannot operate in conjunction with a capacitive isolation barrier, as would be desirable in order to eliminate the high cost and slow speed of the prior optoelectronic and magnetic transformer isolation barriers used in most isolation amplifiers. In this reference, the signal coupled across the isolation barrier is differentiated with an RC time constant that allows the resulting pulse coupled across the isolation barrier to "droop" through an operational amplifier offset voltage, resulting in inaccurate triggering. Such inaccurate triggering results in inaccurate decoding and consequently inaccurate analog output signal levels. The foregoing references do not provide the guidance needed by one skilled in the art to make a low cost, reliable, isolation amplifier having high isolation voltage, high bandwidth, and wide dynamic range.

SUMMARY OF THE INVENTION

Accordingly, it is an object of the invention to provide a low cost isolation amplifier having a high isolation voltage and greater bandwidth and wider dynamic range than has been available in prior art isolation amplifiers.

It is another object of the invention to provide an isolation amplifier circuit and technique that avoid direct integrating of signals coupled across an isolation barrier to reconstruct the analog input signal applied to the isolation amplifier.

It is another object of the invention to provide an isolation amplifier which has exceptionally good high frequency common mode rejection.

It is another object of the invention to provide isolation amplifier circuitry that avoids inaccuracies inherent in zero crossing detection circuitry.

It is another object of the invention to provide an isolation amplifier circuit that operates effectively with capacitive, magnetic or optical isolation barriers.

Briefly described, and in accordance with one embodiment thereof, the invention provides an isolation amplified including an encoder receiving an analog input signal and producing a first complementary pair of signals applied to a pair of isolation barrier elements, a differentiating circuit differentiating the first pair of complementary signals to produce a second pair of complementary signals, a sense amplifier including a differential amplifier receiving the second pair of complementary signals to produce an amplified output signal, a pair of comparators receiving the amplified output signal, and a flip-flop, the outputs of the comparator driving the flip-flop to reconstruct the signal produced by the encoder. A decoder receives the result to reconstruct a first pair of complementary signals. In one described embodiment of the invention, the isolation barrier elements are 3 picofarad fringe capacitors produce voltage spikes which precisely represent the times of occurrence of rising and falling edges of the first pair of complementary signals. The encoder includes an input voltage-to-frequency converter that produces the first pair of complementary signals. The reconstructed signals are fed into one set of inputs of a phase detector circuit that also receives the output of a second voltage-to-frequency converter which is identical to the first voltage-to-frequency converter. The output of the phase detector is integrated by a lag/lead filter circuit that produces an analog control voltage. The analog control voltage controls the output frequency of the second voltage-to-frequency converter to produce a phase locked loop when the analog control voltage suitably matches the analog input voltage. The isolation amplifier provides an isolation voltage greater than 1500 volts and a bandwidth of about 70 kilohertz. The circuit operates effectively with magnetic elements for the isolation barrier or with optoelectronic elements for the isolation barrier. In one embodiment of the invention, a pair of capacitors function as an isolation barrier for information, while a toroidal transformer simultaneously functions as an isolation barrier for power.

BRIEF DESCRIPTION OF THE DRAWINGS

FIG. 1 is a block diagram of the isolation amplifier of the present invention.

FIG. 2 is a block diagram of the isolation amplifier of the present invention utilizing a phase locked loop as a decoder.

FIG. 3 is a diagram showing waveforms produced by the isolation amplifiers of FIGS. 1 and 2.

FIG. 4 is a schematic circuit diagram of the differential driver circuitry in FIG. 1.

FIG. 6 is a logic diagram of the phase detector contained in FIG. 2.

FIGS. 7A and 7B are diagrams of waveforms useful in describing the operation of the phase detector circuit shown in FIG. 6.

FIG. 9 is a simplified circuit schematic diagram of the lag/lead filter in the block diagram of FIG. 2.

FIG. 10 is a simplified circuit diagram of the low pass filter in the block diagram of FIG. 2.

FIG. 11 is a detailed schematic circuit diagram of the lag/lead filter of FIG. 9.

FIG. 12 is a detailed schematic circuit diagram of the low pass filter of FIG. 10.

DESCRIPTION OF THE IVENTION

Figure 5:
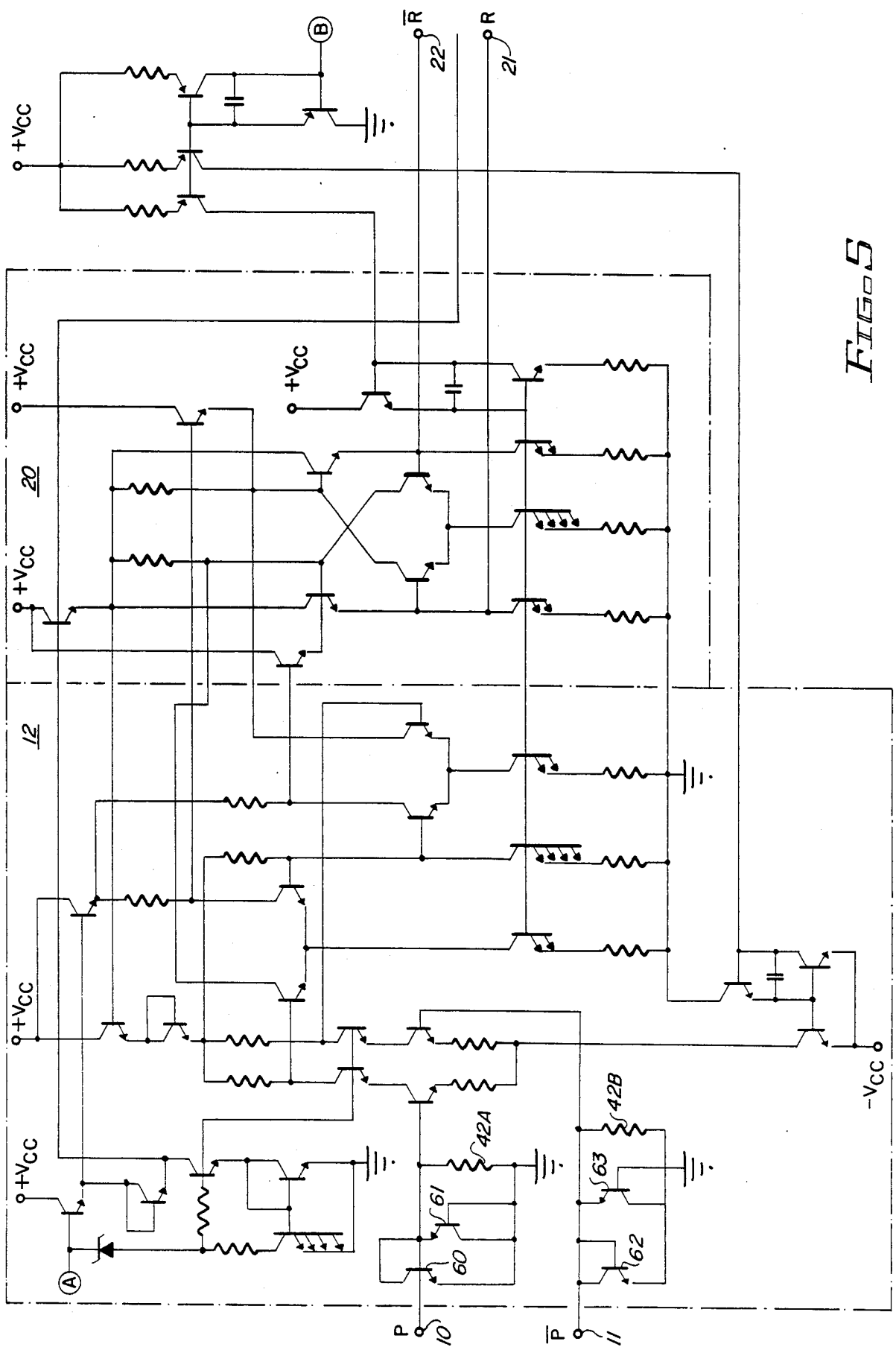
FIG. 5 is a schematic circuit diagram of the sense amplifier shown in the block diagram of FIG. 2.

Referring now to FIG. 1, isolation amplifier 1 includes an encoder 2 having an input 3 to which an analog input voltage $V_i$ is applied. Encoder 2 produces an encoded output $F_i$ on an output conductor 4. The encoded signal $F_i$ is applied to an input of a differential driver circuit 5, which produces a replica F of the signal $F_i$ on conductor 6 and also produces its logical complement F* on conductor 7. (Note that since the printer being utilized cannot overstrike, asterisks are used herein to designate logical complements.)

Conductors 6 and 7 each are connected to one terminal of isolation barrier capacitors 8 and 9, respectively, each being matched to have a low capacitance $C_B$, of about 3 picofarads. The second terminals of the isolation barrier capacitors 8 and 9 are connected to conductors 10 and 11, respectively. A signal P which is the differential of F appears on conductor 10, and a signal P* which is the differential of F* appears on conductor 11. Conductors 10 and 11 are connected to the inputs of a differential amplifier 12, the output of which produces a signal T on conductor 13. The signal T is a replica of P. Conductor 13 is connected to the positive input of a comparator 14 having its negative input connected by conductor 15 to a positive threshold voltage $V_{th+}$.

Conductor 13 also is connected to the negative input of a comparator 16 having its positive input connected by conductor 17 to a conductor of a negative threshold voltage $V_{th-}$. The outputs of comparators 14 and 16 are connected by conductors 18 and 19 to the S and R inputs, respectively, of an RS flip-flop 20. The Q output of flip-flop 20 is connected by conductor 21 to an input of a decoder 23. Another input of decoder 23 is connected by conductor 22 to the Q* output of flip-flop 20. The signals R and R*, which are reconstructed versions of F and F*, respectively, appear on conductors 21 and 22, respectively. The output of decoder 23 produces a signal $V_0$, which is an analog replica of $V_i$, on conductor 24.

The waveforms of F, F*, P, P*, T, and R are shown in FIG. 3. It can be seen that the P and P* waveforms have leading edges that correspond precisely to the leading edges of F and F*, respectively. Both the P and P* waveforms return rapidly to zero, long before the occurrence of the next transition of F or F*. On the T waveform in FIG. 3, reference numerals 13A designate the $V_{th+}$ threshold level, and reference numerals 13B designate the $V_{th-}$ threshold level, at which the comparators 16 and 14 respectively, switch, setting and resetting flip-flop 20 to "reconstruct" the R and R* waveform, which are slightly delayed, extremely precise replicas of the F and F* waveforms, respectively.

In accordance with the present invention, the isolation barrier capacitors 8 and 9 can be the 3 picofarad fringe capacitors described in the above-referenced copending Meinel application.

In accordance with a presently preferred embodiment of the invention, the encoder is a voltage-to-frequency converter, the circuitry of which can be similar or idetical to that in the assignee's commercially marketed hybrid integrated circuit voltage-to-frequency converter, Burr-Brown Model VFC 320, in combination with a differential driver circuit to drive the two isolation capacitors. If this circuit is utilized, then it is convenient to implement decoder 23 by means of a phase locked loop circuit that uses an identical voltage-to-frequency converter (VFC) as a local oscillator.

Referring now to FIG. 2, the above-mentioned presently preferred implementation of the invention is shown, wherein "input VFC" 2A includes a differential driver, and produces the signals F and F* on conductors 6 and 7. Sense amplifier 12A includes differential amplifier 12, comparators 14 and 16, and RS flip-flop 20 of FIG. 1, producing R and R* on conductors 21 and 22. R and R* are fed into a phase locked loop (PLL) circuit 23A which includes a phase detector 25 receiving the differential signals R and R* as inputs. Phase detector 25 compares the phases of R and R* with those of a pair of differential signals Q and Q* appearing on conductors 31 and 32, respectively.

Phase detector 25 produces a U* signal on conductor 26, representing an "up signal", and also produces a signal D* on conductor 27, representing a "down signal". Conductors 26 and 27 are fed into a lag/lead filter 28 that integrates U* and D* to produce an analog signal $V_F$, which is a scaled replica of $V_i$, on conductor 29. 1 Conductor 29 is applied to a control input or analog input of output VFC 30, which is identical to input VFC 2A. The outputs of VFC 30 are connected to conductors 31 and 32. The $V_F$ signal on conductor 29 is applied to an input of low pass filter 33, the output of which produces a filtered output signal $V_o$ on conductor 24. The basic operation of the isolation amplifier of FIG. 1 and also of the preferred embodiment of FIG. 2 is that a digital version of the analog input signal $V_i$ is produced by encoder 2 or input VFC 2A, thereby producing the differential input signals F and F* applied to the left-hand terminals of the isolation barrier capacitors 8 and 9 Contrary to the prior art, however, the signals F and F* are not coupled for this entire duration across the isolation barrier capacitors, and then integrated to reconstruct the analog input signal. Instead, the times corresponding to the transitions of the signals F and F* are what in essence is coupled across the isolation barrier capacitors 8 and 9. The differentiated "spike" signals P and P* are precisely detected, always at the same threshold levels, by comparators 14 and 16 to set or reset flip-flop 20 at times that correspond precisely to the occurrence of the transitions of F and F*. Consequently, the signals R and R* are very precise but slightly delayed (by about 10 nanoseconds) replicas of F and F*, respectively.

In the embodiment of FIG. 2, the fact that output VFC 30 is identical to input VFC 2A causes the frequency of Q and Q* to be identical to the frequency of F and F* when $V_F$ is equal to $V_i$.

The basic operation of the phase locked loop 23A can be understood with reference to FIGS. 7A and 7B. Referring first to FIG. 7A, phase detector 25 produces an up signal U* on conductor 26 when Q lags R. The width of the U* waveform is equal to the duration of the delay between the leading edges of R and Q. If this condition occurs, the U* signal is integrated by lag/lead filter 28, causing $V_F$ to increase in proportion to such duration. This in turn increases the frequency of Q and Q*, reducing the delay between Q and R. If Q and R are precisely in phase, then both U* and D* are zero, and $V_F$ remains steady. $V_F$ then is equal to $V_i$.

If the opposite condition exists, that is, if Q leads R, then phase detector 25 produces the signal D* on conductor 27. As shown in FIG. 7B, the duration of D* is equal to the amount by which Q leads R. This reduces $V_F$ in proportion to such duration, causing output VFC 30 to decrease in frequency so that the frequency of Q will be reduced to match the frequency of R.

The purpose of low pass filter 33 is to reduce the amount of AC ripple on conductor 29, so that the output signal $V_o$ on conductor 24 is a precise, ripple-free replica of the analog input signal $V_i$. Thus, the phase locked loop circuit 23A forces the frequencies of Q and R to be equal, thereby forcing $V_o$ to be equal to $V_i$. Consequently, the stability in transient response of the isolation amplifier 1 is determined entirely by the VFC transfer function, the phase detector gain, and the loop filter characteristics.

FIG. 4 shows a detailed circuit schematic diagram of the differential driver 5. The structure and operation will be easily understood by those skilled in the art, so it simply is disclosed herein as being representative of applicant's presently preferred best mode of practicing the invention. Note, however, that diode-connected transistor 56 has its base and collector connected to conductor 6 and its emitter connected to ground. Diode 57 has its base and collector connected to ground and its emitter connected to conductor 6. Similarly, the anode of clamping diode 58 is connected to conductor 7 and its emitter is connected to ground. The anode of clamping diode 59 is connected to ground and its emitter is connected to conductor 7.

These clamping diodes limit the transitions of F and F* to approximately ±0.7 volts. If an extremely large transient voltage is superimposed upon $V_i$, for example in response to an electrostatic discharge or an electromagnetic pulse, clamping diodes 56-59 can shunt very large currents to ground for the likely duration of such pulses, and prevent large excursions of F and F*.

Referring next to FIG. 5, a detailed schematic circuit diagram of the sense amplifier 12A, including differential amplifier 12 and RS flip-flop 20, is shown to disclose applicant's presently preferred best mode of practicing the invention. The circuitry includes a very conventional ECL (emitter-coupled logic) differential amplifier and a conventional ECL RS flip-flop. Since this circuitry is highly conventional, it will not be described in detail. However, clamping diodes 60 and 61 have their anodes and cathodes connected, respectively, to conductor 10. The cathode of diode 60 and the anode of diode 61 are connected to ground. Similarly, the anode of clamping diode 62 and the cathode of clamping diode 63 are connected to conductor 11. The cathode of diode 62 and the anode of diode 63 are connected to ground. A low resistance resistor 42A is connected between conductor 10 and ground A resistor 42B precisely matched thereto is connected between conductor 11 and ground. Resistors 42A and 42B cooperate with isolation barrier capacitors 8 and 9, respectively, to accomplish the above-mentioned differentiation of F and F* to produce the differentiated signals P and P*, respectively.

In the present embodiment of the invention, the time constant of these two differentiating circuits is only about 9 nanoseconds. Consequently, the signals P and P* return very rapidly to zero, as shown in the waveforms of FIG. 3, long before the next transition of F and F*. Therefore, the transition times of the trailing edges of P and P* have no influence on the times at which the comparators 14 and 16 detect the threshold points 13A and 13B of the T waveform in FIG. 3. The very fast trailing edge transitions of P and P* and T permit very high frequency operation, up to about 1.5 megahertz, thereby providing an analog signal bandwidth of about 70 kilohertz.

The purpose of the clamping diodes 60-63 in FIG. 5 is the same as the function of clamping diodes 56-59, that of limiting the amplitude of the transitions of P and P* during large induced transients.

A block diagram of an ECL implementation of the phase detector 25 is shown in FIG. 6. The R input is designated by reference numeral 21A, indicating that it actually represents both the R and R* complementary inputs that are characteristic of ECL circuitry, as those skilled in the art readily recognize. Q conductor 31A actually represents both the Q and Q* conductors in an ECL circuit implementation. ECL NOR gate 34 produces a logical complement output that is applied to the R input of RS flip-flop 35, and also to one input of OR/NOR gate 36, the logical complement output of which is connected to an input of NOR gate 34. The Q output of flip-flop 35 is connected to one input of OR/NOR gate 36 and also to one input of NOR gate 41. The output of NOR gate 34 also is connected to an input of NOR gate 41. The output of NOR gate 41 is connected to an input of OR/NOR gate 36 and to an input of OR/NOR gate 39, and also to the set inputs of both flip-flops 35 and 38.

The output of NOR gate 37 is connected to the R input of flip-flop 38, to an input of NOR gate 41, and to an input of OR/NOR gate 39. The inverting output of OR/NOR gate 39 is connected to an input of NOR gate 37. The noninverting output of OR/NOR gate 37 produces the U* signal on conductor 26. The inverting output of OR/NOR gate 39 produces the D* signal on conductor 40. One skilled in the art can easily verify that the circuit of FIG. 6 produces the waveforms shown in FIGS. 7A and 7B.

Figure 8:
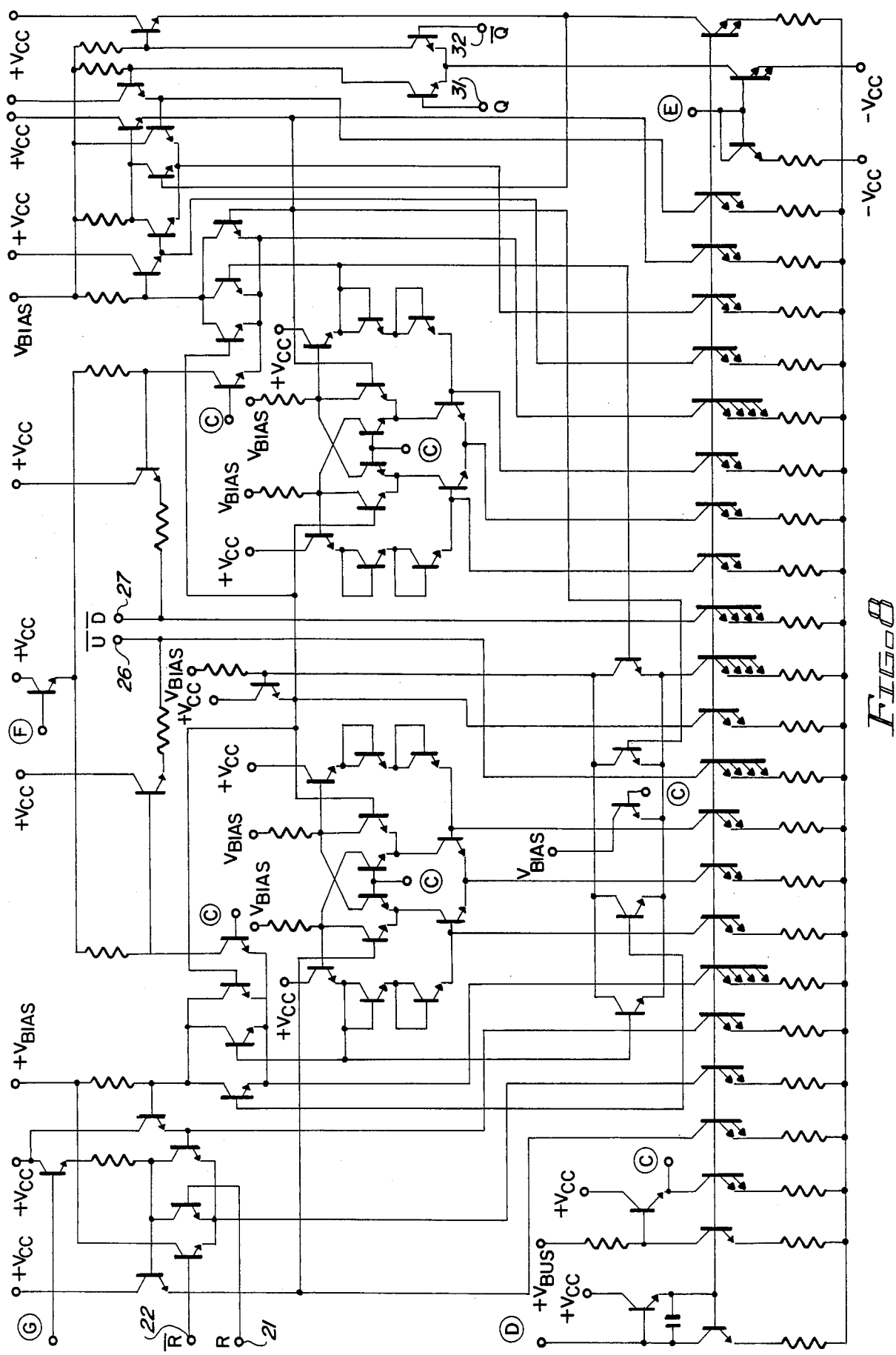
FIG. 8 is a schematic circuit diagram of the phase detector shown in FIG. 6.

FIG. 8 shows a detailed circuit schematic diagram of the presently preferred implementation of the phase detector shown in FIG. 6. One skilled in the art can readily understand the operation and structure of the circuit shown in FIG. 8, so it is being shown herein merely to disclose applicant's presently preferred best mode of practicing the invention.

In FIG. 9, a simplified circuit schematic diagram of the lag/lead filter 28 is shown. The U* conductor 26 is coupled by a resistor 43 to the inverting input of operational amplifier 46, one terminal of feedback capacitor 47, and to one terminal of resistor 45. The other terminal of resistor 45 and the other terminal of capacitor 47 are both connected to one terminal of capacitor 48, the other terminal of which is connected by conductor 29 to the output of operational amplifier 46. The D* conductor 27 is connected by resistor 44 to the noninverting input of operational amplifer 46 and also to one terminal of resistor 49 and capacitor 50. The other terminals of resistor 49 and capacitor 50 are connected to one terminal of capacitor 51, the other terminal of which is connected to ground. The applicant's best mode of implementing lag/lead filter 28 is shown in FIG. 11.

Low pass filter 33 can be implemented as shown in the simplified schematic in FIG. 10, wherein the VF conductor 29 is connected by resistor 52 to one terminal of resistor 53 and to one terminal of capacitor 33A, the other terminal of which is connected to output conductor 24. The other terminal of resistor 53 is connected to the noninverting input of operational amplifier 54, the inverting input of which is connected to conductor 24. The noninverting input of operational amplifier 54 is connected to one terminal of capacitor 55, the other terminal of which is connected to ground. Applicant's best mode of implementing the low pass filter 33 shown in FIG. 10, is set forth in FIG. 12.

Thus, the above-described embodiments of the invention provide a low cost, reliable isolation amplifier that meets the objectives of the invention. Use of fringe capacitor isolation barrier coupling avoids the high cost and low bandwidth of prior art magnetic and optoelectronic isolation barrier coupling. Low bandwidth associated with prior encoders, such as voltage-to-duty cycle converters, the output of which must be integrated to reconstruct the input analog signal, is avoided. However, it should be noted that the above-described circuitry will function effectively, although at reduced system bandwith with other types of encoders than voltage-to-frequency encoders.

As indicated in the copending Meinel application, using the 3 picofarad fringe capacitors to obtain isolation barrier capacitors 8 and 9 produces isolation voltages of 1500 volts for metalization spacings of 20 mils, and 3500 volts for metalization spacings of 25 mils. The small physical size of the fringe coupling capacitors the cost of the isolation amplifier significantly over what would be required if larger isolation barrier capacitance values were used.

The described circuit is much less sensitive to component and processing variations and barrier coupling nonlinearities than prior isolation amplifiers. The accuracy of the present isolation amplifier depends more on matching of the input VFC and the output VFC than on absolute accuracy of various components. The tracking filter nature of the phase locked loop detector circuitry allows wider bandwidth, faster settling, and lower ripple than would be the case for duty-cycle modulation encoders. The above advantages of the invention are obtained despite the fact that a fairly expensive, low jitter VFC circuit must be utilized for both the input VFC and the output VFC to achieve optimum noise performance. A high speed phase detector circuit is required to achieve low ripple and low distortion.

While the invention has been described with reference to several particular embodiments thereof, those skilled in the art will be able to make various modifications to the described embodiments without departing from the true spirit and scope of the invention. For example, numerous other encoder and decoder circuits could be utilized. The phase locked loop circuit could be implemented in numerous other ways by those skilled in the art. Different filtering circuits could be utilized. An isolation transformer can be used to provide the isolation barrier, with the R/L time constant being short enough to provide the accuracy and bandwidth needed.

I claim:
1. An isolation amplifier comprising in combination:
(a) means for encoding an analog input signal to produced a first pulse signal, the times of occurrence of certain edges of the first pulse signal being precisely representative of the level of the analog input signal;
(b) isolation barrier means for receiving the first pulse signal on a first terminal, coupling a portion of the first pulse signal to a second terminal, and providing a high electrical isolation voltage between the first and second terminals;
(c) means for differentiating the first pulse signal as it is coupled across the isolation barrier means to produce a second pulse signal having certain edges that precisely represent the times of occurrence of the certain edges of the first pulse signal;
(d) means for sensing the certain edges of the second pulse signal and means responsive to the sensing means for producing a third pulse signal which is a reconstructed replica of the first pulse signal, the third pulse signal having certain edges the times of occurrences of which are precisely representative of the level of the analog input signal; and (e) means for decoding the third pulse signal to produce an analog output signal the level of which precisely represents the level of the analog input voltage, wherein the encoding means includes a differential output stage that produces the first pulse signal and also produces a fourth pulse signal which is the logical complement of the first pulse signal, and wherein the isolation barrier means includes a first capacitor connected between the first and second terminals, and a second capacitor precisely matched with the first capacitor, the second capacitor being connected between third and fourth terminals, the third terminal receiving the fourth pulse signal, the second capacitor coupling a portion of the fourth pulse signal to the fourth terminal and providing a high electrical isolation voltage between the third and fourth terminals.

2. The isolation amplifier of claim 1 wherein the differentiating means includes the first and second capacitors and also includes first and second resistors, the first resistor being connected between the second terminal and a reference voltage conductor, the second resistor being connected between the fourth terminal and a reference voltage conductor, the portion of the fourth pulse signal coupled across the second capacitor to the fourth terminal forming a fifth pulse signal.

3. The isolation amplifier of claim 2 wherein the sensing means includes first and seocnd comparators each having a reference input connected to relatively positive and negative reference threshold voltages, respectively, a differential amplifier having a pair of inputs connected, respectively, to the second and fourth terminals and an output connected to another input of each of the first and second comparators, and wherein the means for producing the third pulse signal includes a flip-flop having inputs connected to outputs of the first and second comparators, one output of the flip-flop producing the third pulse signal, and another output of the flip-flop producing a sixth pulse signal that is a logical complement of the third pulse signal.

4. The isolation amplifier of claim 3 further including a first diode having its anode connected to the first terminal and its cathode connected to a reference voltage conductor, a second diode having its cathode connected to the first terminal and its anode connected to the reference voltage conductor, a third diode having its anode connected to the third terminal and its cathode connected to the reference voltage conductor, and a fourth anode having its cathode connected to the third terminal and its anode connected to the reference voltage conductor, the first, second, third, and fourth diodes limiting the amplitude of transitions of the first and fourth pulse signals and absorbing large transient currents resulting from large common load transient voltages occurring on the analog input voltage.

5. The isolation amplifier of claim 4 including a fifth diode having its anode connected to the second terminal and its cathode connected to the reference voltage conductor, a sixth diode having its cathode connected to the second terminal and its anode connected to the reference voltage conductor, a seventh diode having its anode connected to the fourth terminal and its cathode connected to the reference voltage conductor and a eighth diode having its cathode connected to the fourth terminal and its anode connected to the reference voltage conductor, the fifth, sixth, seventh, and eighth diode limiting transistions of the second pulse signal and the fifth pulse signal and absorbing large transient currents induced on the second and fourth terminals as a result of large transient voltages induced in the isolation amplifier 6. The isolation amplifier of claim 2 wherein the differentiating means produces voltage spikes on the second and fourth terminals, which voltage spikes are very short compared to the interval between successive pulses of the first and fourth pulse signals.

7. The isolation amplifier of claim 6 including first and second comparators each having a reference input connected to relatively positive and negative reference threshold voltages, respectively, a differential amplifier having a pair of inputs coupled, respectively, to the second and fourth terminals and an output coupled to another input of the first and second comaprators, wherein the spikes of the first and fourth pulse signals decay to a zero reference level substantially before the occurrence of the next edge of either said first pulse signal or said fourth pulse signal, whereby the same relative level of each spike is sensed by the first and second comparators, thereby causing the first and second comparators to very precisely switch at times corresponding precisely to the times of occurrence of the certain edges of the first pulse signal.

8. The isolation amplifier of claim 1 wherein the encoding means includes a first voltage-to-frequency converter.

9. The isolation amplifier of claim 8 wherein the decoding means includes a second voltage-to-frequency converter, a phase detector, and a lag/lead filter, the phase detector having a first pair of input terminals receiving the third pulse signal and a sixth pulse signal, respectively, the phase detector also including a second pair of inputs receiving complementary output signals of the second voltage-to-frequency converter, the phase detector producing an output signal representative of the relative lag or lead between the third pulse signal and an output of the second voltage frequency converter, the lag/lead filter operatively integrating the lag/lead output signal produced by the phase detector to produce an analog control voltage, the output of the lag/lead filter applying the analog control voltage to a control input of the second voltage-to-frequency converter, the analog control voltage controlling the output frequency of the second voltage-to-frequency converter to produce a phase locked loop when the analog control voltage attains a predetermined relationship to the analog input voltage.

10. The isolation amplifier of claim 9 wherein the first and second voltage-to-frequency converters are essentially identical, whereby the analog control voltage precisely matches the analog input voltage.

11. The isolation amplifier of claim 10 further including a low pass filter receiving the analog control voltage and producing a filtered analog output voltage.

12. The isolation amplifier of claim 1 wherein the first and second capacitors each have a capacitance of approximately 3 picofarads.

13. The isolation amplifier of claim 1 wherein the first and second capacitors are planar fringe capacitors.

14. The isolation amplifier of claim 13 wherein the breakdown voltage of the first and second capacitors exceeds 1500 volts.

15. A method of operating an isolation amplifier comprising the steps of:

(a) encoding an analog input signal to produce a first pulse signal, the times of occurrence of certain edges of the first pulse signal being precisely representative of the level of the analog input signal, and producing a second pulse signal that is the logical complement of the first pulse signal;

(b) coupling a portion of each of the first and second pulse signals across an isolation barrier;

(c) differentiating the first and second pulse signals as they coupled across the isolation barrier to produce differentiated third and fourth pulse signals each having certain edges corresponding precisely to the times of occurrence of the certain edges of the first pulse signal;

(d) amplifying the third and fourth pulse signals to produce a differential signal;

(e) applying the differential signal to inputs of first and second comparators that sense relative positive and negative excursions of the differential signal, causing the first and second comparators to switch at times precisely corresponding to the leading and trailing edges of the first pulse signal;

(f) setting and resetting a flip-flop in response to the output of the first and second comparators to produce reconstructed replicas of the first and second pulse signals; and (g) decoding the precisely reconstructed replicas to produce an analog output voltage that bears a precise predetermined relationship to the analog input voltage.

16. A method of operating an isolation amplifier comprising the steps of:

(a) encoding an analog input signal to produce a first pulse signal, the time of occurrence of certain edges of the first pulse signal being precisely representative of the level of the analog input signal, and producing a second pulse signal that is the logical complement of the first pulse signal;

(b) coupling a portion of each of the first and second pulse signals across an isolation barrier;

(c) differentiating the first and second pulse signals as they are coupled across the isolation barrier to produce differentiated third and fourth pulse signals each having certain edges corresponding precisely to the times of occurrence of the certain edges of the first pulse signal;

(d) amplifying the third and fourth pulse signals to produce a differential signal; and (e) applying the differential signal to inputs of first and second comparators that sense relative positive and negative excursions of the differential signal, causing the first and second comparators to switch at times precisely corresponding to the leading and trailing edges of the first pulse signal.

17. An isolation amplifier comprising in combination:

(a) means for encoding an analog input signal to produce a first pulse signal, the times of occurrence of certain edges of the first pulse signal being precisely representative of the level of the analog input signal, the encoding means including means for producing a second pulse signal that is the logical complement of the first pulse signal;

(b) first and second isolation barrier means for coupling a portion of each of the first and second pulse signals, respectively, from the encoding means to first and second terminals;

(c) means for differentiating the first and second pulse signals as they are coupled across the first and second isolation barrier means, respectively, to produce differentiated third and fourth pulse signals each having certain edges corresponding precisely to the times of occurrence of the certain edges of the first pulse signal;

(d) means for amplifying the third and fourth pulse signals to produce a differential signal;

(e) first and second comparators; and (f) means for applying the differential signal to inputs of the first and second comparators to cause the first and second comparators to sense relative positive and negative excursions of the differential signal, and thereby cause the first and second comparators to switch at times precisely corresponding to the leading and trailing edges of the first pulse signal.

18. The isolation amplifier of claim 17 wherein the differentiating means includes first and second input impedances, the first input impedance being matched to the second input impedance, and wherein the first and second isolation barrier means have equal impedances, whereby high frequency common mode rejection is improved.

* * * * *